United States Patent [19]

Narayan et al.

[11] 4,147,563
[45] Apr. 3, 1979

[54] METHOD FOR FORMING P-N JUNCTIONS AND SOLAR-CELLS BY LASER-BEAM PROCESSING

[75] Inventors: Jagdish Narayan; Rosa T. Young, both of Knoxville, Tenn.

[73] Assignee: The United States of America as represented by the United States Department of Energy, Washington, D.C.

[21] Appl. No.: 932,154

[22] Filed: Aug. 9, 1978

[51] Int. Cl.$^2$ .................. H01L 21/26; H01L 21/268
[52] U.S. Cl. ..................... 148/1.5; 148/177; 148/178; 148/188; 136/89 TF; 219/121 L; 357/30; 357/91
[58] Field of Search .............. 148/1.5, 188, 177, 178; 357/91, 30; 219/121 L; 136/89 TF

[56] References Cited

U.S. PATENT DOCUMENTS

| 3,458,368 | 7/1969 | Haberecht | 148/175 |
| 3,585,088 | 6/1971 | Schwuttle et al. | 148/174 |
| 3,940,289 | 2/1976 | Marquardt et al. | 148/1.5 |
| 4,059,461 | 11/1977 | Fan et al. | 148/1.5 |

OTHER PUBLICATIONS

Narayan et al., " ... Laser Annealing . . . B-Implanted Si", J. Appl. Phys. 49, (Jul. 1978), 3912.
Geiler et al., " ... Laser ... Diffusion ... As-Implanted Si ... ", Phys. Stat. Sol. 419 (1977), K-171.
Hutchins, "Localized ... Diffusion ... Laser Melting . .. ", IBM-TDB, 16, (1974), 2585.
Grötzschel et al., "Laser Annealing ... Si", Phys. Letts. 61A (1977), 181.
3,420,719 01001969 Potts 148 188
VonGutfeld, "Crystallization of Si ... ", IBM-TDB, 19 (1977), 3955.
Fairfield et al., "Si Diode by . . . Laser Irradication", Sol. State Electronics, 11 (1968), 1175.
Harper et al., ". . . Si Diodes ... Heat Pulses ... Laser", Solid-State Elecronics, 13 (1970), 1103.
Young et al., "Laser Annealing . . . Si", Appl. Phys. Letts. 33, (Jul. 1978), 14.

*Primary Examiner*—L. Dewayne Rutledge
*Assistant Examiner*—Upendra Roy
*Attorney, Agent, or Firm*—Dean E. Carlson; Stephen D. Hamel; Fred O. Lewis

[57] ABSTRACT

This invention is an improved method for preparing p-n junction devices, such as diodes and solar cells. High-quality junctions are prepared by effecting laser-diffusion of a selected dopant into silicon by means of laser pulses having a wavelength of from about 0.3 to 1.1 $\mu$m, an energy area density of from about 1.0 to 2.0 J/cm$^2$, and a duration of from about 20 to 60 nanoseconds. Initially, the dopant is deposited on the silicon as a superficial layer, preferably one having a thickness in the range of from about 50 to 100 A. Depending on the application, the values for the above-mentioned pulse parameters are selected to produce melting of the silicon to depths in the range from about 1000 A to 1 $\mu$m. The invention has been used to produce solar cells having a one-sun conversion efficiency of 10.6%, these cells having no antireflective coating or back-surface fields.

9 Claims, 7 Drawing Figures

METHOD FOR FORMING P-N JUNCTIONS AND SOLAR-CELLS BY LASER-BEAM PROCESSING

BACKGROUND OF THE INVENTION

This invention was made in the course of, or under, a contract with the U.S. Department of Energy.

This invention relates to methods for forming p-n semiconductor junctions, and more particularly to a more rapid, efficient, and inexpensive method for forming such junctions in silicon bodies. The improved method is well adapted for the production of solar cells.

The two most common methods for doping crystalline silicon to form p-n rectifying junctions are ion implantation and high-temperature diffusion. [E. S. Grove, *Physics and Technology of Semiconductor Devices*, John Wiley and Sons, New York (1967); L. Eriksson et al, *Ion Implantation in Semiconductors*, Academic Press, New York (1970)] Both of these techniques are subject to disadvantages. The chief disadvantage of ion-implantation is that the energetic dopant ions produce displacement damage in the silicon crystal, necessitating an additional, carefully controlled annealing operation. The chief disadvantage of high-temperature diffusion is that a dense region of dopant precipitates may be formed very near the surface of the crystal, resulting in a "dead layer" characterized by an extremely short carrier lifetime. In solar cells, this layer limits the short-wavelength photovoltaic response.

A more recently investigated method for the forming of p-n junctions in silicon bodies is the use of laser pulses to induce diffusion of a layer of dopant into the silicon substrate. [J. M. Fairfield and G. H. Schwuttke, *Solid State Electronics*, 11, 1175 (1968); F. I. Harper and M. I. Cohen, *Solid State Electronics*, 13, 1103, (1970); V. A. Dilipovich et al, *Zhurnal Prikladnoi Spektroskopii*, 22, 431 (1975)]. Unfortunately, the techniques reported in these journal articles caused extensive damage of the crystals. The typical product was a small and leaky junction with relatively poor diode characteristics.

The use of laser pulses to repair silicon-crystal damage produced by the ion implantation or high-temperature diffusion of dopants is reported in the literature, as in the following articles: J. Narayan, R. T, Young, and C. W. White, *Journal of Applied Physics*, 49, 3912 (1978); R. T. Young et al, *Journal of Applied Physics*, 33(1) 14 (1978).

OBJECTS OF THE INVENTION

Accordingly, it is an object of this invention to provide an improved method for the production of p-n junction devices.

It is another object to provide a more efficient and reliable method for the production of p-n junction devices by laser-diffusing a dopant into a silicon substrate.

It is another object to provide an improved method for the production of solar cells, which require p-n junctions of relatively large area.

It is still another object to provide an improved method for forming silicides.

Other objects will be made evident hereinafter.

SUMMARY OF THE INVENTION

One form of the invention may be summarized as follows: In a method for producing a p-n junction device, said method including the steps of depositing on a crystalline silicon body a layer of a selected impurity, and irradiating said layer to melt said layer and the contiguous portion of said body and effect diffusion of said impurity into said portion, the improvement comprising effecting said melting and diffusion by irradiating said layer with a laser pulse having a wavelength in the range of from about 0.3 to 1.1 $\mu$m, an energy area density in the range of from about 1.0 to 2.0 J/cm$^2$, and a duration in the range of from about 20 to 60 nanoseconds.

DESCRIPTION OF THE PREFERRED EMBODIMENT

Figure 1:
FIG. 1 is a bright-field micrograph of a silicon substrate on which a selected amount of boron has been deposited.

Our invention is generally applicable to the production of p-n junction devices; the devices may be of relatively small area (e.g., mesa diodes) or relatively large area (e.g. solar cells). Our invention is also applicable to the production of silicides, such as ohmic or rectifying contacts, but for brevity it will be illustrated below primarily in terms of the production of p-n junctions and of solar cells utilizing the same.

Briefly, we have found an improved method for effecting laser-induced diffusion of selected dopants (donor and acceptor impurities) into crystalline silicon. Our method avoids degredation of the minority-carrier lifetime in the substrate and produces a dopant profile which is especially suitable for solar cell applications. The method can be used to produce p-n junctions at least as large as 4 cm$^2$, these junctions having an overall quality at least as high as the quality obtained by conventional thermal-diffusion or ion-implantation techniques. The method can be used to produce solar cells which, without antireflection coatings and back-surface fields, operate with a one-sun conversion efficiency of at least 10.6%.

The following are examples of our method as applied to the production of p-n junction diodes and solar cells utilizing the same.

EXAMPLE 1

Boron Diffused into Silicon with One or More Laser Pulses

Conventional single-crystal wafers of silicon were used as the starting material in this experiment. The following are selected properties of the typical wafer: size, 2×1 cm.; resistivity, 5 $\Omega$/cm; orientation, <100>; method of crystal growth: Czochralski; type of silicon, n (the wafer contained phosphorous dopant in a concentration of about $1 \times 10^{15} \times cm^{-3}$). After degreasing with acetone and drying, the wafers were polished in CP-6 solution (HF:CH$_3$COOH:HNO$_3$ = 1:1:2). The wafers then were rinsed in deionized water and dried.

Various thicknesses of elemental boron were deposited on the resulting wafers in separate runs conducted in a standard vapor-deposition chamber. At the beginning of each run the chamber was pumped down to approximately $1 \times 10^{-6}$ Torr. Vapor-deposition was accomplished by directing the beam from a 10 kw electron-beam source (AIRCO Temescal) onto a pellet formed from 98%-purity natural-boron powder (main impurity, carbon). Throughout the typical deposition run the pressure was maintained below $3 \times 10^{-6}$ Torr. Because of radiant heating, the temperature of the typical wafer rose by about 67° C. during boron deposition. Table 1 shows the nominal amount of boron deposited on various wafers (by "nominal" is meant as determined by microbalance). Typically, the boron was deposited over an area of approximately 2 cm$^2$.

A selected area (approx. 2 cm$^2$) of the boron-coated portion of each wafer then was irradiated (in air) with one or more overlapping pulses from a conventional Q-switched, multi-mode ruby laser having a wavelength of 0.694 μm, a pulse area energy density of 1.5–1.8 J/cm$^2$, and a pulse duration of approx. $50 \times 10^{-9}$ sec (approx. 50 nanoseconds). The beam was defocused in order to irradiate a relatively large area.

As will be discussed, selected characteristics of the irradiated wafers were studied by means of standard techniques. Transmission electron micrographs were made of the "as-deposited" and "as-irradiated" wafers, using a back-thinning technique, special care being taken to protect the deposited-boron layer and the laser-treated layer. Selected electrical-parameters were determined by van der Pauw measurements. [Phillips Technical Review, 21, 220 (1958)] Dopant concentration profiles were obtained by secondary ion mass spectrometry (SIMS), using an ion microprobe. The dark I-V characteristics were measured on small mesa diodes having evaporated-aluminum front contacts and electroless-nickel back contacts.

Figure 2:
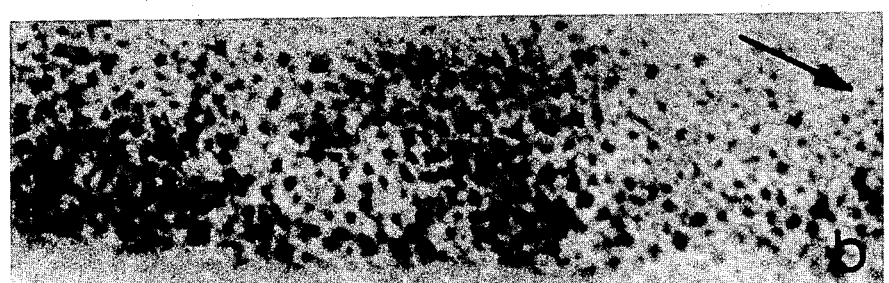
FIG. 2 is a similar micrograph of a silicon substrate on which a larger amount of boron has been deposited.

FIGS. 1 and 2 are bright-field electron micrographs of two wafers (BD-10 and BD-13, Table 1) in the "as deposited" state. As shown, some of the boron was deposited on the silicon in the form of clusters rather than as uniform deposits. Referring to FIG. 1, the average cluster size and number density were estimated to be 100 A and $2 \times 10^{11}$/cm$^2$, respectively. Referring to FIG. 2, the corresponding values were 200 A (angstroms) and $1.6 \times 10^{11}$ cm$^{-2}$ for Wafer BD-13 (which had a thicker boron deposit than did wafer BD-10).

Figure 3:
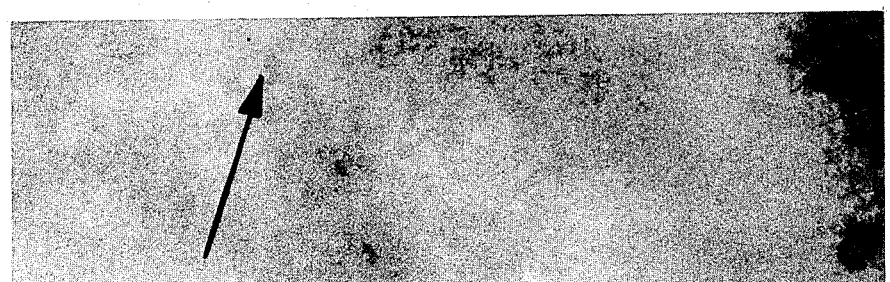
FIG. 3 is a similar micrograph of the specimen shown in FIG. 2 after laser irradiation of the boron-coated surface in accordance with this invention.
Figure 4:
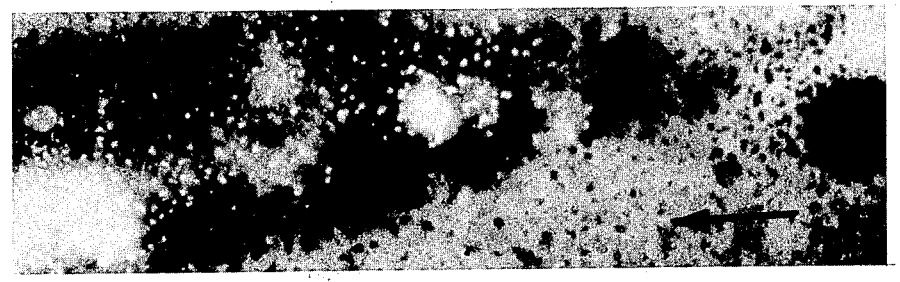
FIG. 4 is a similar micrograph of the irradiated specimen shown in FIG. 3 after it had been subjected to a heat treatment.

FIG. 3 is a micrograph of Wafer BD-13 after laser irradiation in the manner described. No precipitates or dislocations were observed in this sample down to the limit of resolution for the microscope ($\leq 10$ A). This finding was confirmed by electron micrographs made of other wafers prepared and irradiated as described above. Electrical measurements (to be discussed) showed that the concentration of boron in solution after the laser treatment could exceed the equilibrium solubility (approx. $4 \times 10^{20}$ B/cm$^3$). In such instances, subsequent heating of the wafers caused boron to precipitate. For example, Wafer BD-25 was heated at 900° C. in a flowing argon atmosphere for 40 minutes after treatment with the laser. FIG. 4 clearly shows the boron precipitation induced in this wafer by the heating. In other words, operation in accordance with the invention tyically produced a supersaturated, metastable solution.

The results of the electrical measurements in terms of carrier concentration ($N_s$), carrier mobility ($\mu$), and sheet resistivity ($\rho_s$) are given in Table 1. Wafers BD-10, BD-11 and BD-13 underwent one-pulse laser treatment, whereas BD-12 was irradiated with two pulses. As indicated in the tables wafer BD-25 had been heated at low temperature (approx. 600° C.) in an argon, atmosphere for 60 min. after the boron deposition and then treated with one pulse of the laser. (Subsequent experiments have shown that similar results can be obtained without the heat treatment at 600° C.) The concentration of electrically active boron varied from $2.1 \times 10^{15}$ cm$^{-2}$ in wafer BD-10 to $3.13 \times 10^{16}$ cm$^{-2}$ in BD-25 and was found to be approximately proportional to the amount of boron deposited.

Figure 5:
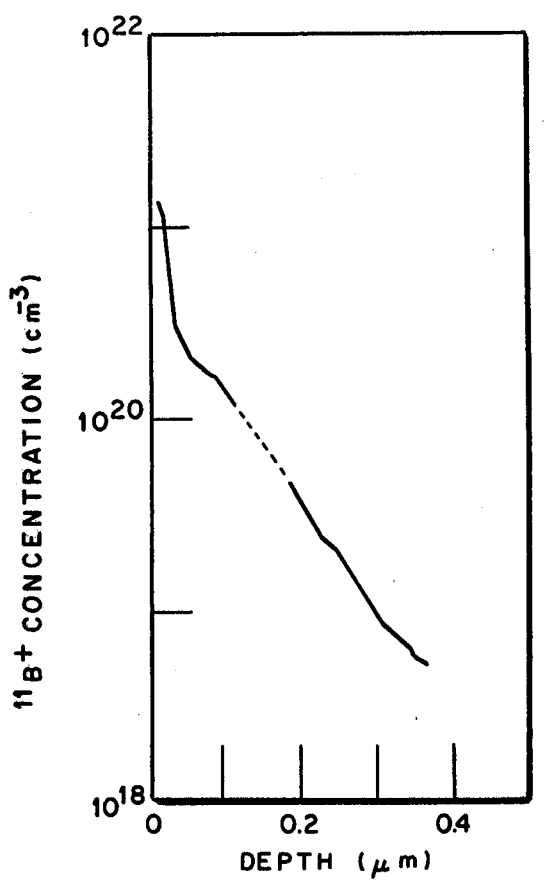
FIG. 5 is a graph depicting the boron-concentration profile produced by laser-diffusing boron into silicon in accordance with this invention.

The above-mentioned SIMS technique was used to determine the boron-concentration profiles for several of the laser-irradiated wafers. For these measurements the primary beam (O$_2^+$, 16 KeV, $15 \times 10^{-9}$ amps, 5 μm diam) was raster-scanned over a large area (approx. 52 μm $\times$ 41 μm) while $^{11}$B+ sputtered ions were detected from approx. 15% of the scanned area using an electronic aperture. The $^{11}$B+ sputtered ion intensities were normalized to the intensity of the $^{30}$Si+ sputtered ions to compensate for any changes in the secondary ion extraction efficiency. The concentration profile of boron atoms for wafer BD-12 (Table 1) is shown in FIG. 5. As indicated, the solubility limit of boron in silicon (approx. $4 \times 10^{20}$ cm$^{-3}$) has been exceeded in the first 300 A of the substrate. Boron-concentration profiles of generally similar shape were obtained for the other wafers (Table 1) examined by the SIMS technique. Dopant profiles of this shape are known to be especially advantageous for solar-cell applications, where surface recombination is a problem.

Figure 6:
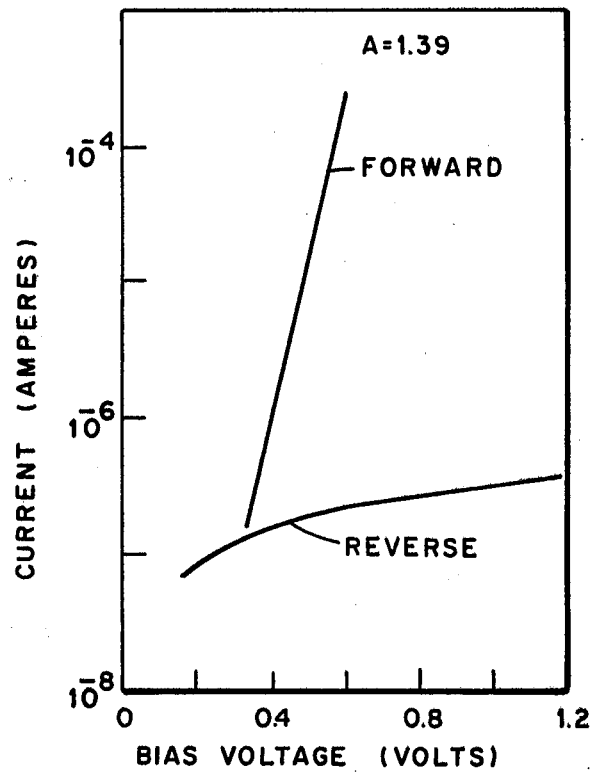
FIG. 6 is a graph showing the dark I-V characteristic of a p-n junction mesa diode produced in accordance with this invention.

The dark I-V characteristic of the p-n junction of a typical mesa diode of wafer BD-12 (Table 1) is shown in FIG. 6. From a fit of the ideal diode equation $I = I_o$ (exp (eV/AkT) − 1) to the curve for forward diode characteristics, the value of A (diode perfection factor) was determined to be 1.39. A reverse diode current of about Table I

| Wafer | Amount of Boron Deposited (Nominal μgm/cm$^2$) | Number of Laser Pulses | Electrical Parameters | | |
|---|---|---|---|---|---|
| | | | Carrier Concentration $N_S$(cm$^{-2}$) | Sheet Resistivity $\rho_s$(Ω/□) | Carrier Mobility $\mu$(cm$^2$/V.S) |
| BD-10 | <1 | 1 | 2.10 × 10$^{15}$ | 80 | 40 |
| BD-11 | 5 | 1 | 8.62 × 10$^{15}$ | 23.8 | 31 |
| BD-12 | 5 | 3 | 9.37 × 10$^{15}$ | 22.0 | 30 |
| BD-13 | 4 | 1 | 6.10 × 10$^{15}$ | 32.0 | 33 |
| BD-25* | 10 | 1 | 3.13 × 10$^{16}$ | 8.2 | 24 |

*Heated at 600° C. for 60 min. after boron-deposition and before treatment with laser $10^{-7}$ amp. cm$^{-2}$ (see FIG. 6) and a value of A of about 1.39 are indicative of a good p-n junction, comparable to those obtained by conventional thermal diffusion techniques.

Preliminary calculations of the thermal and mass transport in a typical wafer (BD-12 Table 1) were carried out by techniques analogous to those described in the following reference relating to the laser-annealing of ion-implanted silicon: Wang et al, *Applied Physics Letters*, (in press) and J. Narayan et al, *Applied Physics Letters*, 33, 338 (1978). The values for the various parameters (thermal and mass diffusion coefficients, absorption coefficient, etc.) were identical to those used therein. It was assumed that the presence of the boron does not substantially alter the absorption coefficient or the reflectivity.

Using conventional techniques, some of the wafers listed in Table 1 were converted to solar cells by providing them with front and back contacts of evaporated aluminum (thickness, 2.5 μm). The front contact was deposited in a standard comb pattern (9% shadow fraction); the ohmic back contact covered essentially all of the back surface of the wafer. These metalization techniques were chosen for convenience and probably are not the most suitable from the standpoint of cell conversion efficiency. No back-surface fields or antireflection coatings were applied.

Figure 7:
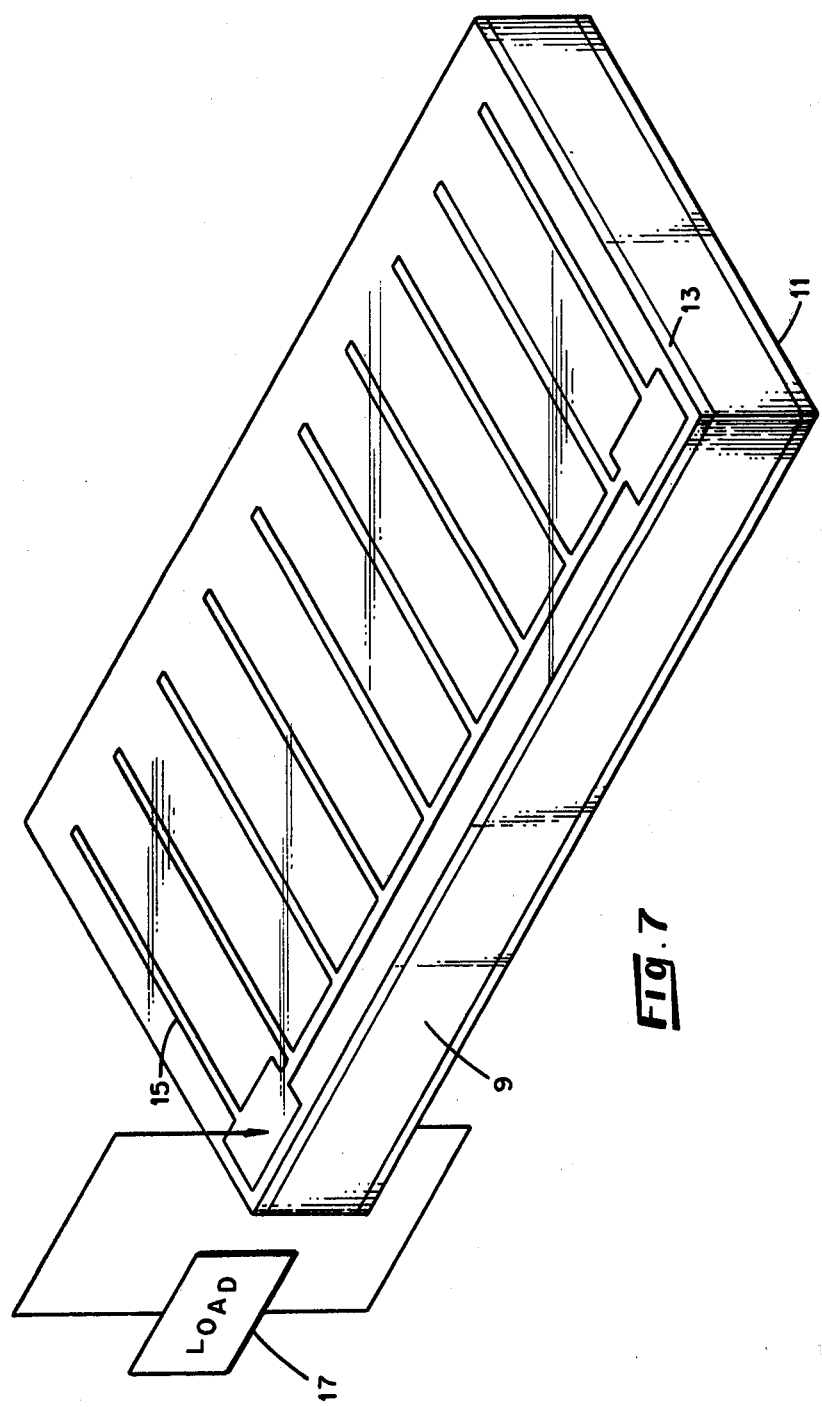
FIG. 7 is a view of a solar cell produced in accordance with this invention.

FIG. 7 shows the typical resulting solar cell in section and illustrates how a load would be connected across the cell. As shown, the typical cell included an n-type base 9, a p-Type diffused layer 13, and front and back contacts 11 and 15, respectively, for connection to any suitable load 17.

The AM$_1$ parameters and the conversion efficiencies for the resulting solar cells were determined by means of conventional tests. For instance, the conversion efficiencies were determined by comparison with conventional solar cells supplied by NASA (Lewis Laboratory). Table 2 presents selected properties from some of these cells and compares them with prior-art cells. The latter were produced from the wafer-type starting material used in Example 1, but diffusion of the boron was effected by the conventional techniques cited in the table. As indicated, the experimental cells were characterized by open circuit voltage ($V_{oc}$), short circuit current ($J_{sc}$), and fill factor (FF) values which in general compared favorably with those for the prior-art cells. As a specific example, the experimental cell designated as BDS-12 in Table 2 operated with efficiency of 9.2%. This cell was produced from wafer BD-12 (see Table 1), which was treated with three laser pulses to effect diffusion of the boron. The three pulses were required to completely cover the area of the solar cell, with the particular laser arrangement used. The techniques described above were used to produce more than six solar cells of the laser-diffused-boron type having conversion efficiencies in the range of 8.5 to 9.2%. In general, highest efficiencies were obtained with wafers on which the boron was deposited as a layer having a thickness in the range of 2.5 to 4.5 μgm/cm$^2$.

Table 2

Solar-Cell Parameters
(No anti-reflective coatings or back-surface field treatments)

|  | Solar Cell No. | Substrate Resistivity (Ω-cm) | Method of Preparation of Solar Cells | AM$_1$ Parameters | | | One-Sun Efficiency, % |
|---|---|---|---|---|---|---|---|
|  |  |  |  | $J_{sc}$ (mA/cm$^2$) | $J_{oc}$ (mV) | FF |  |
|  | BDS-12 | 6 | Boron-deposited (approx. 3.5 μg/cm$^2$) plus diffusion (3 pulses) | 26 | 543 | 0.65 | 9.2 |
|  | ADS-11 | 6 | Aluminum-deposited (2 μg/cm$^2$) plus laser diffusion (3 pulses) | 27 | 550 | 0.71 | 10.6 |
|  | JN-4 | 6 | Boron-implanted (35 kV, 3 × 10$^{15}$/cm$^2$) plus laser anneal (3 pulses) | 25 | 553 | 0.72 | 10.0 |
| Prior Art | DF-2 | 80 | Boron-implanted (35 kV, 3 × 10$^{15}$/cm$^2$) plus thermal anneal (900° C., 30 min.) | 16 | 465 | 0.65 | 4.9 |
|  | DF-4 | 0.8 | Boron-implanted (35 kV, 3 × 10$^{15}$/cm$^2$) plus thermal anneal (900° C., 5 min.) | 17 | 500 | 0.66 | 5.5 |
|  | D-1 | 5 | Boron-diffused at high temp. (950° C., 30 min.) | 21.5 | 525 | 0.66 | 7.5 |

EXAMPLE 2

Aluminum Diffused into Silicon with Three Laser Pulses

Using the same starting material and treatment techniques cited in Example 1, a solar cell was formed from a wafer on which elemental aluminum had been vapor-deposited in a concentration of 2 μg/cm$^2$. In accordance with the invention, the deposited aluminum was diffused into the silicon with three overlapping laser pulses of the kind specified in Example 1. The size of the resulting p-n junction was approx. 1×2 cm$^2$. The electrical parameters of the diode were determined to be as follows: carrier concentration, 9×10$^{15}$; sheet resistivity, 64; carrier mobility, 10 (all expressed in the units shown in Table 1). Using the techniques described in Example 1, the wafer was provided with evaporated-aluminum front and back contacts. The resulting solar cell, designated as ADS-11 in Table 2, operated with a conversion efficiency of 10.6%.

Referring to our invention more generally, we have found that good-quality junctions are obtained if the laser-induced-diffusion operation is conducted with a laser pulse having a wavelength in the range of 0.3 to 1.1 μm, an energy area density in the range of from about 1.0 to 2.0 J/cm², and a duration in the range of from about 20 to 60 nanoseconds. An energy in the range just specified favors the production of defect-free junctions. That is, as the energy reaches the upper end of the range, excessive melting and loss of dopant by vaporization tend to occur. As the lower end is approached, incomplete diffusion and residual damage tend to occur. The laser may be operated in the multimode or single-mode, the latter generally being preferred in applications where uniformity of the energy distribution is crucial. Any suitable kind of laser may be employed, such as, the Q-switched types. Examples of suitable lasers include the above-mentioned Q-switched ruby laser and the YAG laser. Where large-area junctions are desired, as in solar-cell applications, the laser beam may be de-focused to irradiate the desired area or mechanical scanning of the laser beam may be employed. The irradiation operation may be conducted in any suitable atmosphere or in vacuum. Good results can be obtained with a laser pulse energy area density of from about 1.0 to 2.0 J/cm². Operation below about 1.0 tends to result in poor electrical characteristics, whereas operation above about 2.0 tends to produce craters on the surface, indicating loss of materials by vaporization. With laser pulses of with the specified wavelength and energy density, good results are obtained with pulse durations in the range of from about 20 to 60 nanoseconds.

Our method can be used to produce junctions of various depths. For some applications, such as thyristors and high-power transistors, relatively deep junctions are desired. In such instances, we utilize laser pulses whose wavelength, energy area density, and duration are in the above-specified ranges and whose values are selected to effect melting of the silicon to depths as large as 1 µm. For instance, we have produced satisfactory junctions by melting to a depth of 0.9 µm, using the following combination of Q-switched ruby laser parameters: wavelength, 0.694 µm; energy area density, 2.0 J/cm²; duration, 25 nanoseconds; number of pulses, 3. Referring to shallower junctions, we have found that especially high-quality junctions can be obtained if the silicon is melted to a depth of about 3000 A; however, useful junctions can be obtained by melting to depths of 1000 A or less. Given the teaching herein, one versed in the art will be able to determine the most suitable operating values for a particular application with only routine experimentation.

To reduce evaporation and energy reflection, we usually prefer to deposit the dopant on the silicon as a superficial layer having a thickness in the range of from about 50 to 100 A. Operation in this range promotes the formation of damage-free junctions. The layer of dopant may be deposited by any suitable method as by vapor-deposition or paint-on techniques.

What is claimed is:

1. In a method for producing a p-n junction device, said method including the steps of depositing on a crystalline silicon body a layer of a selected impurity; irradiating said layer with a laser pulse to effect melting of said layer and the contiguous portion of said body and effect diffusion of said impurity into said portion; and providing the resulting body with electrical contacts, the improvement comprising:
    effecting said melting and diffusion by irradiating said layer with a laser pulse having a wavelength in the range of from about 0.3 to 1.1 µm, an energy area density in the range of from about 1.0 to 2.0 J/cm², and a duration in the range of from about 20 to 60 nanoseconds.

2. The method of claim 1 wherein said layer of said impurity corresponds to an impurity concentration in the range of from about 2.0 to 4.5 µgm/cm².

3. The method of claim 1 wherein said laser pulse is generated by a laser selected from the group consisting of Q-switched lasers.

4. A method for the production of a p-n junction device comprising:
    (a) depositing on crystalline silicon a superficial layer of a selected impurity,
    (b) irradiating said layer with at least one laser pulse having a wavelength in the range of from about 0.3 to 1.1 µm, an energy area density in the range of from about 1.0 to 2.0 J/cm², and a duration in the range of from about 20 to 60 nanoseconds, and
    (c) providing the resulting composite with at least two electrically conductive contacts.

5. The method of claim 4 wherein said silicon is n-type silicon and said impurity is an acceptor-type dopant.

6. The method of claim 4 wherein said silicon is p-type silicon and said impurity is a donor-type dopant.

7. The method of claim 4 wherein said layer has a thickness in the range of from about 50 to 100 A.

8. The method of claim 4 wherein said wavelength, energy area density, and duration are selected to have values effecting melting of said silicon to a depth in the range of from about 1000 A to 1 µm.

9. A method for producing a solar cell, said method comprising:
    (a) depositing on a front face of crystalline silicon wafer a superificial layer of a selected impurity, said layer having a thickness in the range of from about 50 to 100 A;
    (b) irradiating said layer with at least one laser pulse having a wavelength in the range of from about 0.3 to 1.1 µm, an energy area density in the range of from about 1.0 to 2.0 J/cm², and a duration in the range of from about 20 to 60 nanoseconds to effect melting of said layer and the contiguous portion of said body; and
    (c) providing the resulting composite with front and back electrically conductive contacts.

* * * * *